United States Patent
Sato

(10) Patent No.: US 7,649,253 B2
(45) Date of Patent: Jan. 19, 2010

(54) SEMICONDUCTOR DEVICE

(75) Inventor: Keisuke Sato, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 133 days.

(21) Appl. No.: 11/512,228

(22) Filed: Aug. 30, 2006

(65) Prior Publication Data

US 2007/0069370 A1   Mar. 29, 2007

(30) Foreign Application Priority Data

Sep. 28, 2005   (JP)   ............... 2005-281145

(51) Int. Cl.
*H01L 23/10*   (2006.01)
(52) U.S. Cl. ...................... 257/706; 257/707
(58) Field of Classification Search .................. 257/625, 257/712, 719
See application file for complete search history.

(56) References Cited

U.S. PATENT DOCUMENTS

| | | | |
|---|---|---|---|
| 5,394,299 A * | 2/1995 | Chu et al. ................... | 361/705 |
| 5,931,222 A | 8/1999 | Toy et al. | |
| 6,259,155 B1 | 7/2001 | Interrante et al. | |
| 6,451,155 B1 | 9/2002 | Toy et al. | |
| 6,964,885 B2 * | 11/2005 | Coico et al. .................. | 438/122 |
| 6,995,463 B1 * | 2/2006 | Sutardja ..................... | 257/686 |
| 2005/0167802 A1 * | 8/2005 | Hirano et al. ............... | 257/678 |
| 2006/0055432 A1 * | 3/2006 | Shimokawa et al. ........... | 327/5 |
| 2006/0091530 A1 * | 5/2006 | Wang ......................... | 257/712 |
| 2006/0255460 A1 * | 11/2006 | Memis ....................... | 257/738 |

FOREIGN PATENT DOCUMENTS

| | | |
|---|---|---|
| CN | 1153401 | 7/1997 |
| JP | 2000-200870 | 7/2000 |
| JP | 2001-203292 | 7/2001 |

* cited by examiner

*Primary Examiner*—Wai-Sing Louie
*Assistant Examiner*—Bilkis Jahan
(74) *Attorney, Agent, or Firm*—Young & Thompson

(57) ABSTRACT

A semiconductor device 1 includes a substrate 10, a semiconductor chip 20 (first semiconductor chip), semiconductor chips 30 (second semiconductor chips) and a heat sink 40. Semiconductor chips 20 and 30 are mounted on the substrate 10. The level of the top surface of the semiconductor chip 20 on the substrate 10 is lower than the level of the top surface of the semiconductor chip 30. A heat sink 40 is fixed to the semiconductor chip 20. Among the semiconductor chip 20 and the semiconductor chips 30, only above the semiconductor chip 20 is provided with the heat sink 40.

26 Claims, 13 Drawing Sheets

SEMICONDUCTOR DEVICE

This application is based on Japanese patent application No. 2005-281145, the content of which is incorporated hereinto by reference.

BACKGROUND

1. Technical Field

The present invention relates to a semiconductor device.

2. Related Art

In recent years, a type of semiconductor device called "system in package" (SIP) including a plurality of semiconductor chips mounted on a substrate is widely applied to various types of electronic equipments, in addition to a type of semiconductor device called system on chip (SOC). Since a combination of existing semiconductor chips can be utilized in the SIP device, it is often the case that the SIP device is more advantageous than SOC device, in view of reducing a manufacturing cost and a turn around time (TAT) for development. Consequently, the SIP device is a more promising semiconductor device than the SOC device.

In the meantime, typical SIP device is generally provided with a heat sink for efficiently releasing heat generated in the semiconductor chip to the outside thereof. Such heat sink is generally provided to cover the whole of the multiple semiconductor chips mounted on the substrate. Typical semiconductor devices including such heat sink are described in Japanese Laid-open patent publication No. 2001-203292 (patent document 1), Japanese Patent publication No. 3228339 (patent document 2), and U.S. Pat. No. 6,259,155 (patent document 3).

In a semiconductor device described in the patent document 1, semiconductor chips are mounted on a ball grid allay (BGA) substrate, and a heat spreader (heat sink) is provided above thereof. In addition, in semiconductor devices described in the patent documents 2, 3, semiconductor chips and chip-shaped electrical components are mounted on a substrate, and a heat sink is provided above thereof. In particular in a semiconductor device described in the patent document 3, a level (height from the substrate) of the top surface of the semiconductor chip is lower than a level of the top surface of the chip-shaped electrical component. The above-described heat sinks have a general structure, in which a portion thereof facing the semiconductor chip is protruded, and therefore a portion thereof located above the semiconductor chip is thicker than other portions.

SUMMARY OF THE INVENTION

In the semiconductor device described in the patent documents 1 to 3, when a plurality of semiconductor chips having different top levels (height of top surface from the substrate) are mounted on a substrate, a top level of their heat sink is equal to or higher than a combination of a thickness of the heat sink and the top level of the semiconductor chip having the highest top level among the mounted chips. This is because the heat sink is provided so as to cover all of a plurality of semiconductor chips, as described above. Therefore, there is a room for improvement in reducing the thickness of the whole device in the conventional semiconductor device.

According to the present invention, there is provided a semiconductor device, comprising a substrate; a first semiconductor chip and a second semiconductor chip provided on the substrate; and a heat sink fixed onto the first semiconductor chip, wherein a height of a top surface of the first semiconductor chip from the substrate is lower than a height of a top surface of the second semiconductor chip from the substrate, and wherein the heat sink is provided only above the first semiconductor chip out of the first and second semiconductor chips.

In such semiconductor device according to the above-described aspect of the invention, the first semiconductor chip having relatively lower top surface level and the second semiconductor chip having relatively higher top surface level are mounted on the same substrate. A heat sink is provided only above the first semiconductor chip. As such, the thickness of the whole device can be reduced as compared with a case of providing heat sinks above respective semiconductor chips, by providing a heat sink only above the semiconductor chip having the relatively lower top surface.

According to the present invention, a semiconductor device having a structure suitable for reducing the thickness of the whole device can be achieved.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments of semiconductor devices according to the present invention will be described as follows in further detail, in reference to the annexed figures. In the figures, identical numeral is assigned to an element commonly appeared in the figures, and redundant descriptions thereof will not be presented.

Figure 1:
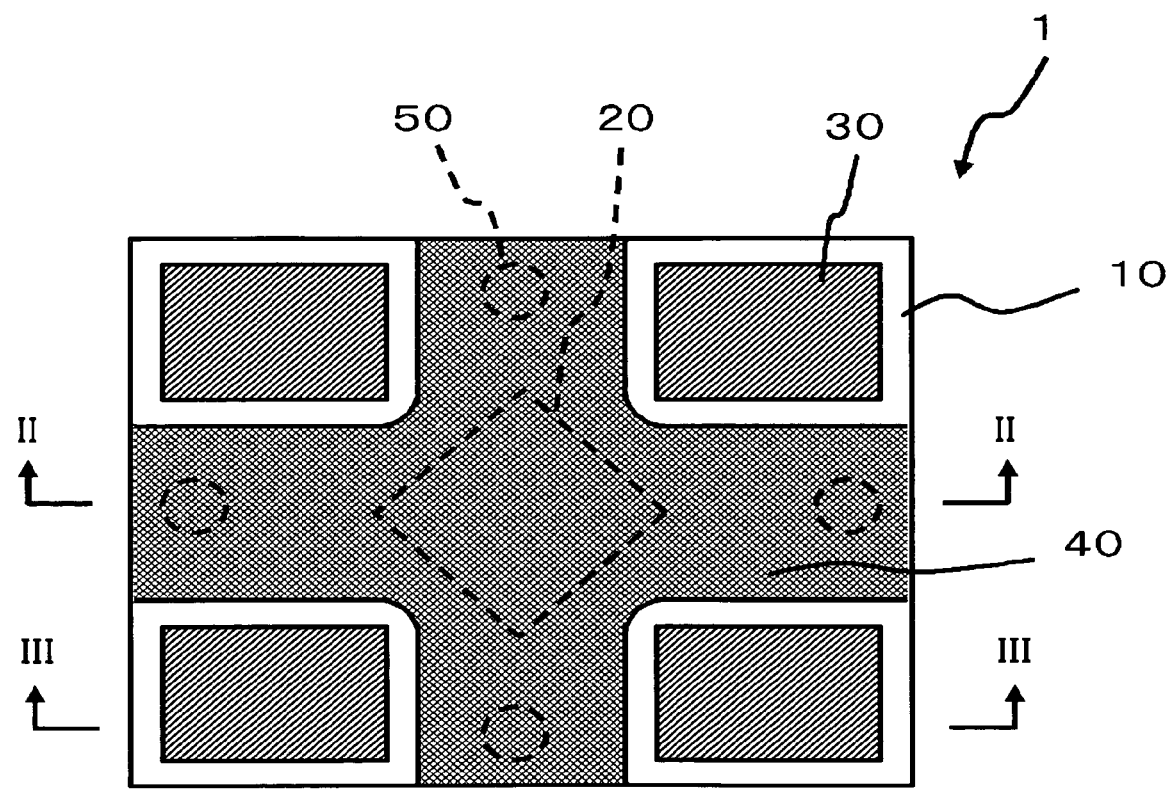
FIG. 1 is a plan view, showing an embodiment of a semiconductor device according to the present invention.
Figure 2:
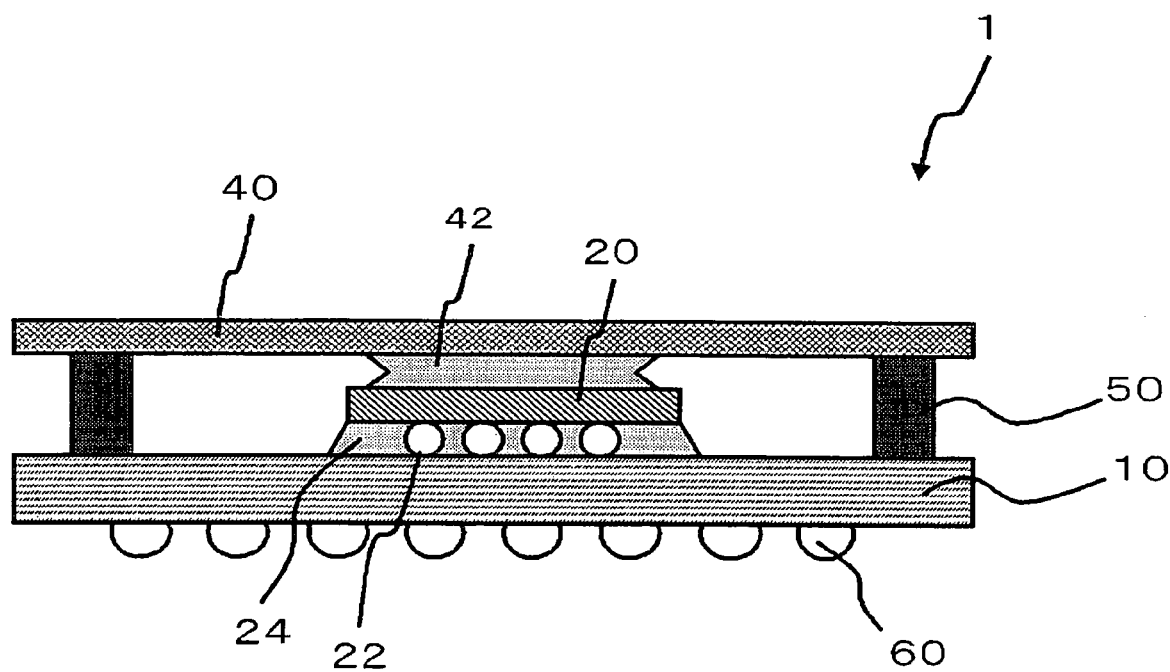
FIG. 2 is a cross-sectional view of the device along line II-II of FIG. 1.
Figure 3:
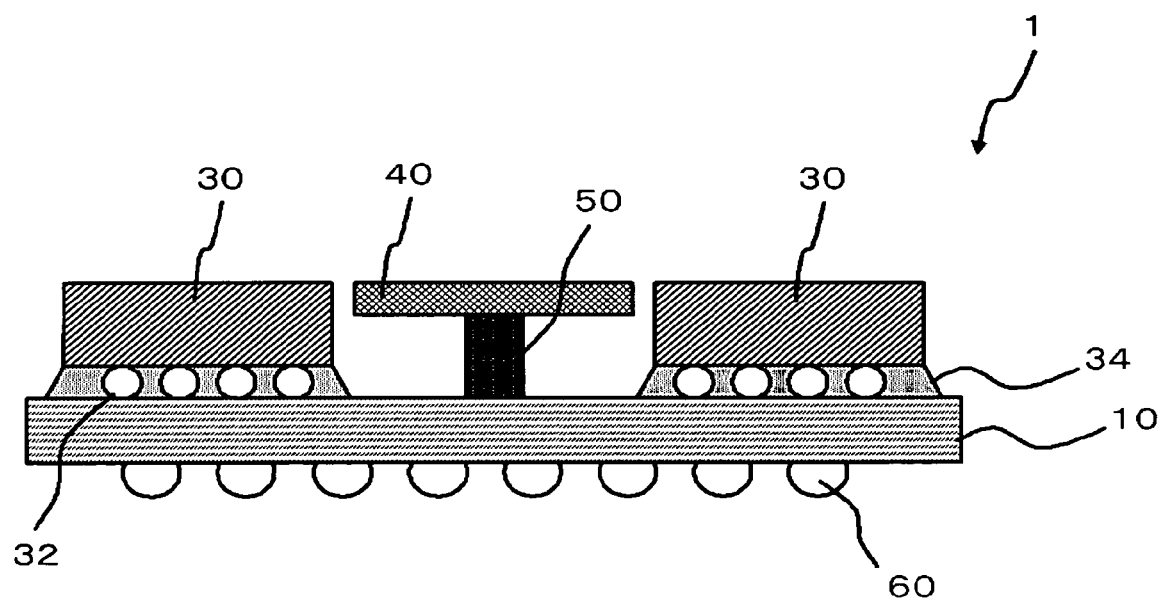
FIG. 3 is a cross-sectional view of the device along line III-III of FIG. 1.

FIG. 1 is a plan view, illustrating an embodiment of a semiconductor device according to the present invention. FIG. 2 and FIG. 3 are views showing cross-sections along line II-II line and along line III-III of FIG. 1, respectively. As shown in these figures, a semiconductor device 1 includes a substrate 10, a semiconductor chip 20 (first semiconductor chip), semiconductor chips 30 (second semiconductor chips) and a heat sink 40.

The substrate 10 is, for example, a resin substrate. Interconnects, which are not illustrated in these figures, are formed on the substrate 10. The semiconductor chips 20 and 30 are mounted on the substrate 10. In the present embodiment, a semiconductor chip 20 and a plurality of (four) semiconductor chips 30 are provided. More specifically, in planar view, one semiconductor chips 30 is disposed in vicinity of each side of the semiconductor chip 20. In the present embodiment, the semiconductor chips 20 and 30 are a logic circuit and memory circuits, respectively. The semiconductor chip 20 is a bare chip, and on the contrary, the semiconductor chip 30 is a memory package, which is formed by being packaged. Typical logic circuits available in the embodiment include application-specific integrated circuit (ASIC), micro processing unit (MPU), micro controller unit (MCU), application specific standard product (ASSP) and the like. Typical memory circuits available in the embodiment include dynamic random access memory (DRAM), static random access memory (SRAM), flash memory and the like.

Solder balls 22 are disposed under the semiconductor chip 20, and the semiconductor chip 20 is electrically coupled to the substrate 10 via these solder balls 22. Further, an insulating underfill resin 24 fills spacings formed between the substrate 10 and the semiconductor chip 20. More specifically, the semiconductor chip 20 is flip-chip mounted on the substrate 10. In addition to above, typical solder material available for composing the solder ball 22 may be, for example, eutectic solder.

External electrode terminals 32 are disposed under the semiconductor chip 30, and the semiconductor chip 30 is electrically coupled to the substrate 10 via the external electrode terminals 32. Further, an insulating underfill resin 34 fills spacings formed between the substrate 10 and the semiconductor chip 30. More specifically, the semiconductor chip 30 is ball grid allay (BGA)-mounted on the substrate 10. In addition to above, typical material available for composing the external electrode terminal 32 may be, for example, eutectic solder, lead (Pb)-free solder or the like. Here, a height of the top surface of the semiconductor chip 20 from the substrate 10 (i.e., top surface level of the semiconductor chip 20 disposed on the substrate 10) is lower than the top surface level of the semiconductor chip 30.

A heat sink 40 is fixed to the semiconductor chip 20. More specifically, the heat sink 40 is provided above the semiconductor chip 20 via an adhesive material 42. It is preferable to employ a material having higher thermal conductivity for the adhesive material 42. The adhesive material 42 may be formed of an insulating adhesive material such as insulating resins and the like, or may be formed of an electroconductive adhesive material such as silver paste and the like. Among the semiconductor chip 20 and the semiconductor chips 30, only above the semiconductor chip 20 is provided with the heat sink 40. As can be seen from FIG. 3, the top surface of the heat sink 40 disposed on the substrate 10 is substantially coplanar with the top surface of the semiconductor chip 30. Further, the heat sink 40 is flat plate-shaped. Typical materials available for the heat sink 40 may include, for example, a plate of a metal such as copper (Cu), aluminum (Al), aluminum silicon carbide (AlSiC) and the like.

Figure 4:
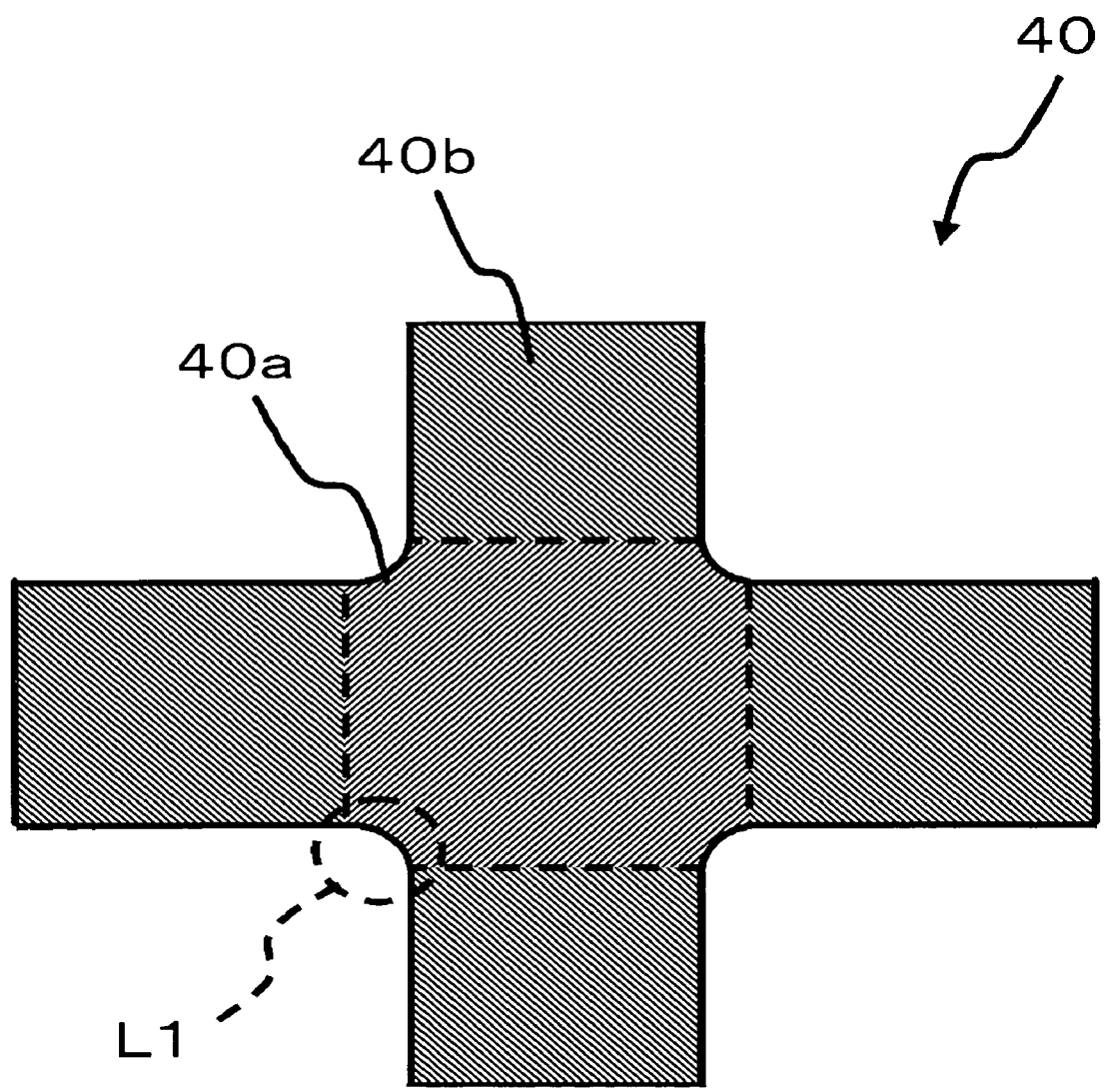
FIG. 4 a plan view of a heat sink shown in FIG. 1, useful in describing a configuration of the heat sink.

As can be seen from FIG. 1, the heat sink 40 has a geometry of a rectangle partially having defected portions. In particular in the present embodiment, the geometry of the heat sink 40 is a rectangle having defected portions in the respective four corners. Then, each of the defected corners (defected portions) is provided with the semiconductor chip 30 described above. As described above, a plurality of semiconductor chips 30 are provided, and portions of the heat sink 40 extend to spacings between a plurality of semiconductor chips 30. In another point of view, the heat sink 40 includes a base 40a and protruding portions 40b extending from the base 40a, as shown in FIG. 4. The base 40a is located above the semiconductor chip 20, and the respective protruding portions 40b extend to the spaces between the semiconductor chips 30.

Further, each corner of the heat sink 40 (portion surrounded with dotted lines L1 in FIG. 4) is rounded. This provides a structure of having no sharp corners in planar view in boundaries between the heat sink 40 and the defected portions.

Now, returning to FIG. 1 to FIG. 3, the semiconductor device 1 further comprises resin posts 50 and external electrode terminals 60. The resin posts 50 are provided between the substrate 10 and the heat sink 40. One end of the resin post 50 is connected to the substrate 10, and the other end is connected to the heat sink 40. In particular, in the present embodiment, as can be seen from FIG. 1, the resin posts 50 are connected to four protruding portions 40b of the heat sink 40, respectively. Typical materials available for forming the resin post 50 may include, for example, a silicone resin. The external electrode terminals 60 are formed on the lower surface of the substrate 10 (a side opposite to the surface for mounting the semiconductor chips 20 and 30). The external electrode terminals 60 function as external electrode terminals for the semiconductor device 1.

Subsequently, advantageous effects obtainable by employing the configuration of the semiconductor device 1 will be described. In the semiconductor device 1, the semiconductor chip 20 having relatively lower top surface level and the semiconductor chips 30 having relatively higher top surface levels are mounted on one substrate 10. Among the semiconductor chip 20 and the semiconductor chips 30, only above the semiconductor chip 20 is provided with the heat sink 40. As such, the thickness of the whole device can be reduced by providing a heat sink only above the semiconductor chip having the relatively lower top surface, as compared with a case of providing heat sinks above the all semiconductor chips. Thus, a semiconductor device having a structure suitable for reducing the thickness of the whole device is achieved. The reduced thickness of the whole device is advantageous in installing devices on mobile electronic equipments or the like, which are generally required to install a number of components within narrower spaces.

Figure 11:
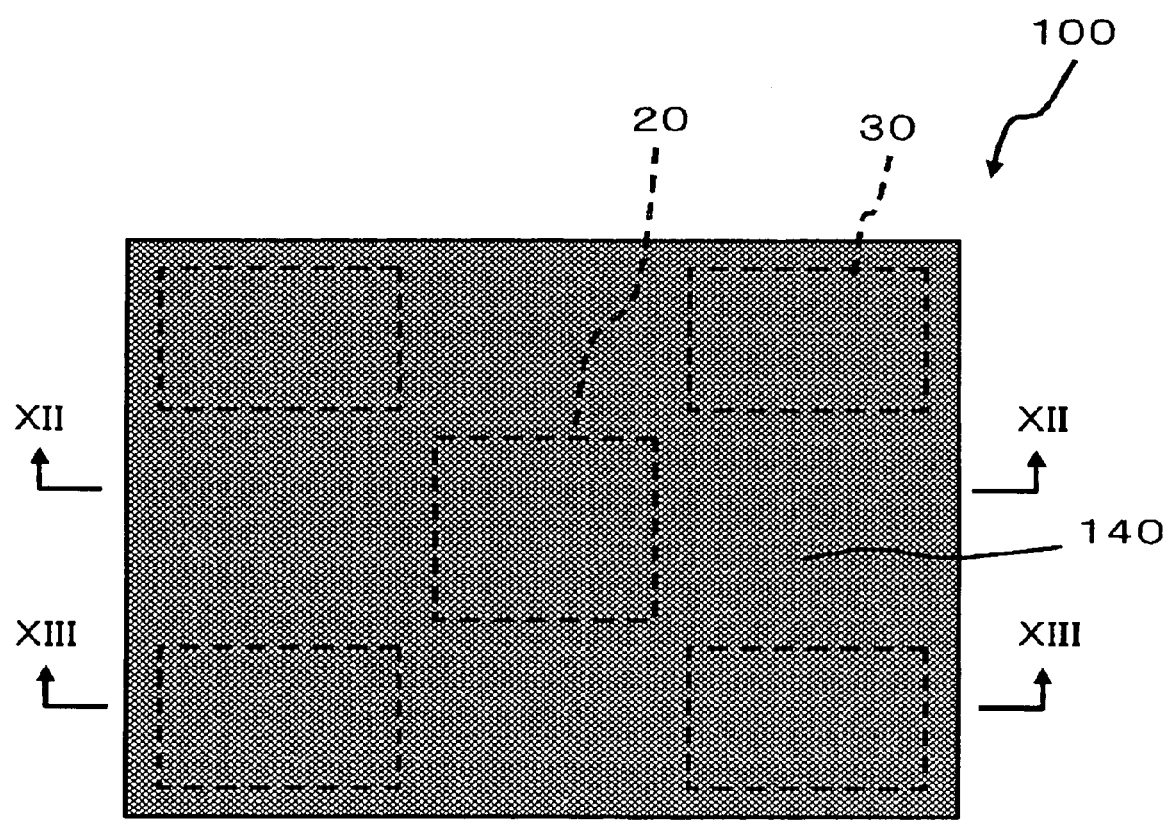
FIG. 11 is a plan view, showing a semiconductor device according to a comparative embodiment.
Figure 12:
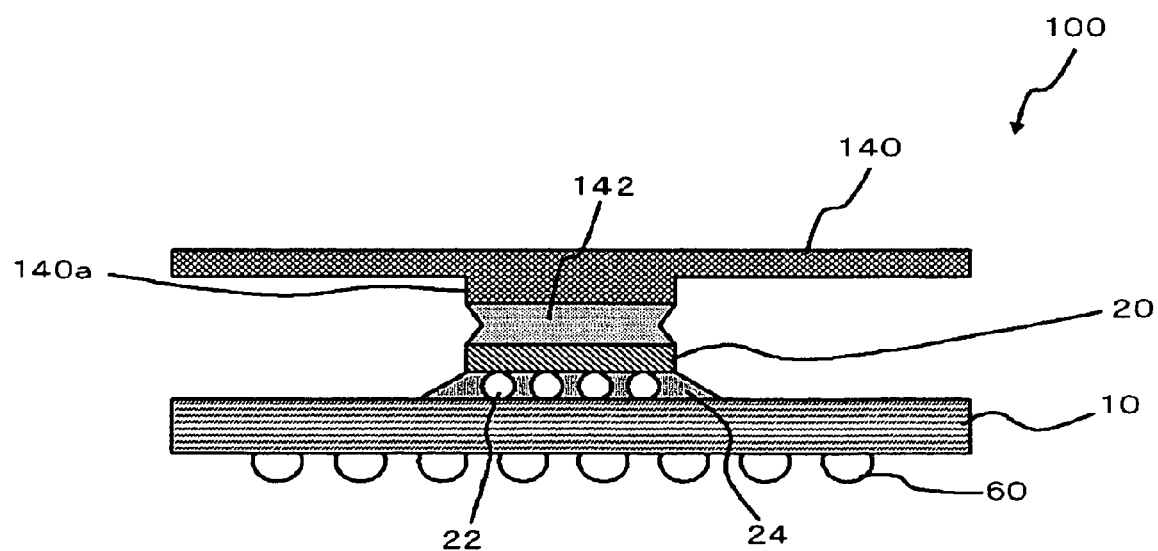
FIG. 12 is a cross-sectional view of the device along line XII-XII of FIG. 11.
Figure 13:
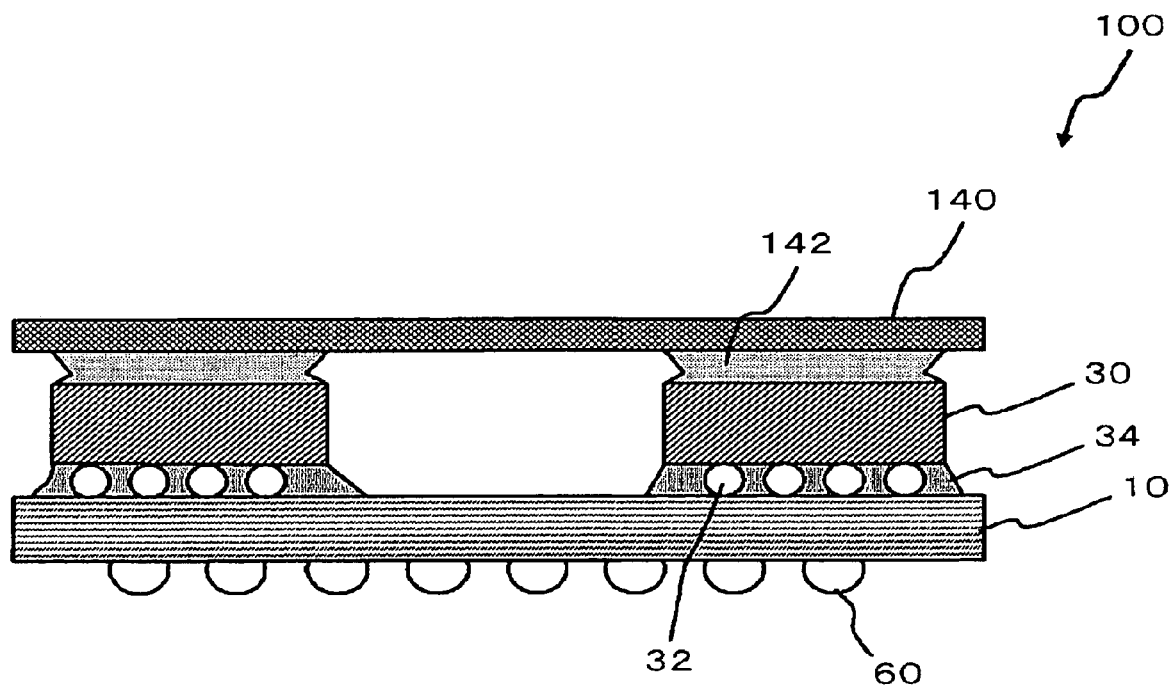
FIG. 13 is a cross-sectional view of the device along line XIII-XIII of FIG. 11.

For the purpose of comparison, a semiconductor device according to a comparative example, which is useful in clarifying the advantageous effects of the semiconductor device 100, is shown in FIG. 11 to FIG. 13. FIG. 11 is a plan view of the semiconductor device 100. FIG. 12 and FIG. 13 are views showing cross-sections along line XII-XII line of FIG. 11 and along line XIII-XIII, respectively. In the semiconductor device 100, the semiconductor chip 20 and the semiconductor chips 30 are mounted on the substrate 10, similarly as in the case of the semiconductor device 1 according to the embodiment of the present invention. On the other hand, in the semiconductor device 100 in the comparative embodiment, the constitution of the heat sink 140 is different from the configuration of the heat sink 40 of the semiconductor device 1.

More specifically, the heat sinks 140 according to the comparative embodiment are provided above the semiconductor chip 20 and the semiconductor chips 30. As can be seen from FIG. 13, the heat sink 140 is fixed to the semiconductor chips 30 via adhesive materials 142, in addition to being fixed to the semiconductor chip 20. Further, as can be seen from FIG. 12, a portion of the heat sink 140 (coupling portion with the semiconductor chip 20) is thicker than other portions thereof, since the level of the top surface of the semiconductor chip 20 is lower than that of the semiconductor chips 30. More specifically, the heat sink 140 includes a protruding portion 140a, which is composed of a portion that faces to the semiconductor chip 20 protruding toward thereof.

When the protruding portion 140a of the heat sink 140 is in contact with the top surface of the semiconductor chip 20, the heat sink 140 floats off from the top surface of the semiconductor chip 30, thereby providing extremely unstable adherence of the heat sink 140 thereto. Consequently, a large quantity of the adhesive material 142 should be disposed between the top surface of the semiconductor chip 20 and the protruding portion 140a, for the purpose of ensuring the sufficient thickness therebetween.

In the semiconductor device 100 having such constitution, the heat sink 140 also extends to cover the semiconductor chips 30. Therefore, the height of the top surface of the heat sink 140 from the substrate is equal to or larger than a combination of a height of the top surface of the semiconductor chip 30 from the substrate and the thickness of the heat sink 140. On the contrary, since the heat sink 40 is not provided above the semiconductor chips 30 in the semiconductor device 1, the height of the top surface of the heat sink 40 from the substrate can be designed to be shorter than a combination of the height of the top surface of the semiconductor chip 30 from the substrate and the thickness of the heat sink 40. Actually, the top surface of the heat sink 40 is substantially coplanar with the top surface of the semiconductor chip 30 in the semiconductor device 1, and thus the height thereof is smaller than the above-described combination of the height and the thickness.

Further, unlike the semiconductor device 100, it is not necessary to provide a sufficient distance between the top surface of the semiconductor chip 20 and the heat sink 40 in the semiconductor device 1, so that the thickness of the adhesive material between the semiconductor chip 20 and the heat sink 40 can be reduced. It is preferable to provide smaller thickness of the adhesive material, in view of effectively transfer heat generated in the semiconductor chip 20 to the heat sink 40. Therefore, according to the configuration of the semiconductor device 1, a heat releasing effect equivalent to or higher than that obtained in comparative example can be obtained, even if the heat sink 40 having smaller surface area than the heat sink 140 is employed.

Further, since the heat sink 40 is flat plate-shaped, the manufacture thereof is simple and easy, as compared with the heat sink 140 that is required to have uneven thickness distribution. Since such heat sink 40 can be manufactured via a stamping processing, for example, the heat sink can be manufactured with lower cost, as compared with the heat sink 140 that should be manufactured via a machining processing.

Further, in the conventional semiconductor device 100, the semiconductor chip 30 is adherently fixed to the heat sink 140. Thus, a stress generated by a difference in the thermal expansion coefficient between the substrate 10 and the heat sink 140 is exerted on the external electrode terminals 32. This leads to a reduced reliability in the mounting of the semiconductor chips 30. On the contrary, since the semiconductor chip 30 is not adherently fixed to the heat sink 40 in the semiconductor device 1, the stress exerting to the external electrode terminal 32 can be avoided.

The semiconductor chip 20 and the semiconductor chips 30 are a logic circuit and memory circuits, respectively. In general, the memory circuit is thicker, but provides lower generation of heat than the logic circuit. Accordingly, the semiconductor device 1 is particularly useful, which is capable of effectively dissipating a heat generated in the logic circuit through the heat sink 40, while the reduced thickness of the whole device can be provided.

The semiconductor chip 20 is a bare chip, and on the other hand, the semiconductor chip 30 is a packaged chip. In general, a packaged chip is thicker than a bare chip. Accordingly, the constitution, in which the heat sink 40 is provided only on the relatively thin bare chip as in the semiconductor device 1, is particularly critical for achieving a reduced thickness of the whole device.

The top surface of the heat sink 40 is substantially coplanar with the top surface of the semiconductor chip 30, in terms of the distance from the substrate 10. Accordingly, the semiconductor device 1 is easy to mount on other devices such as a heat sink.

The resin posts 50 are provided between the substrate 10 and the heat sink 40. This provides more surely fixing of the heat sink 40. Further, this configuration also promotes a relaxation of a stress, which is generated due to a difference in thermal expansion coefficient between the substrate 10 and the heat sink 40 and is exerted on the portion (solder ball 22) connecting the semiconductor chip 20 and the substrate 10. When silicone resin is employed for the material of the resin post 50, the resin post 50 having higher resistance to a stress can be obtained, due to a higher viscosity of the silicone resin.

When a plate of a metal such as Cu, Al, AlSiC and the like is employed for the heat sink 40, the heat sink 40 having higher heat-releaseability can be obtained. Among Cu, Al and AlSiC, Cu is a particularly superior choice, in view of higher heat-releaseability and processibility, and lower cost. Further, AlSiC is also a particularly superior choice, in view of lightness.

The heat sink 40 has a geometry of a rectangle partially having defected portions, and the semiconductor chips 30 described above are disposed in these defected portions. Such configuration is suitable for arranging the semiconductor chips 20 and 30 on the substrate 10 at higher density.

Portions of the heat sink 40 extend to spaces between the semiconductor chips 30. This configuration achieves a closely packed arrangement of the semiconductor chips 20 and 30, and further, larger area of the heat sink 40 can be achieved.

The heat sink 40 includes a base 40a and protruding portions 40b protruded from the base 40a. This configuration easily achieves a structure of the heat sink 40, which has the portions (protruding portions 40b) extending to the spaces between the semiconductor chips 30.

No sharp corner in planar view is provided in the boundaries between the heat sink 40 and the defected portions. This configuration provides a prevention from a buckling of the heat sink 40 resulted from a concentration of stress into the corners.

Figure 5:
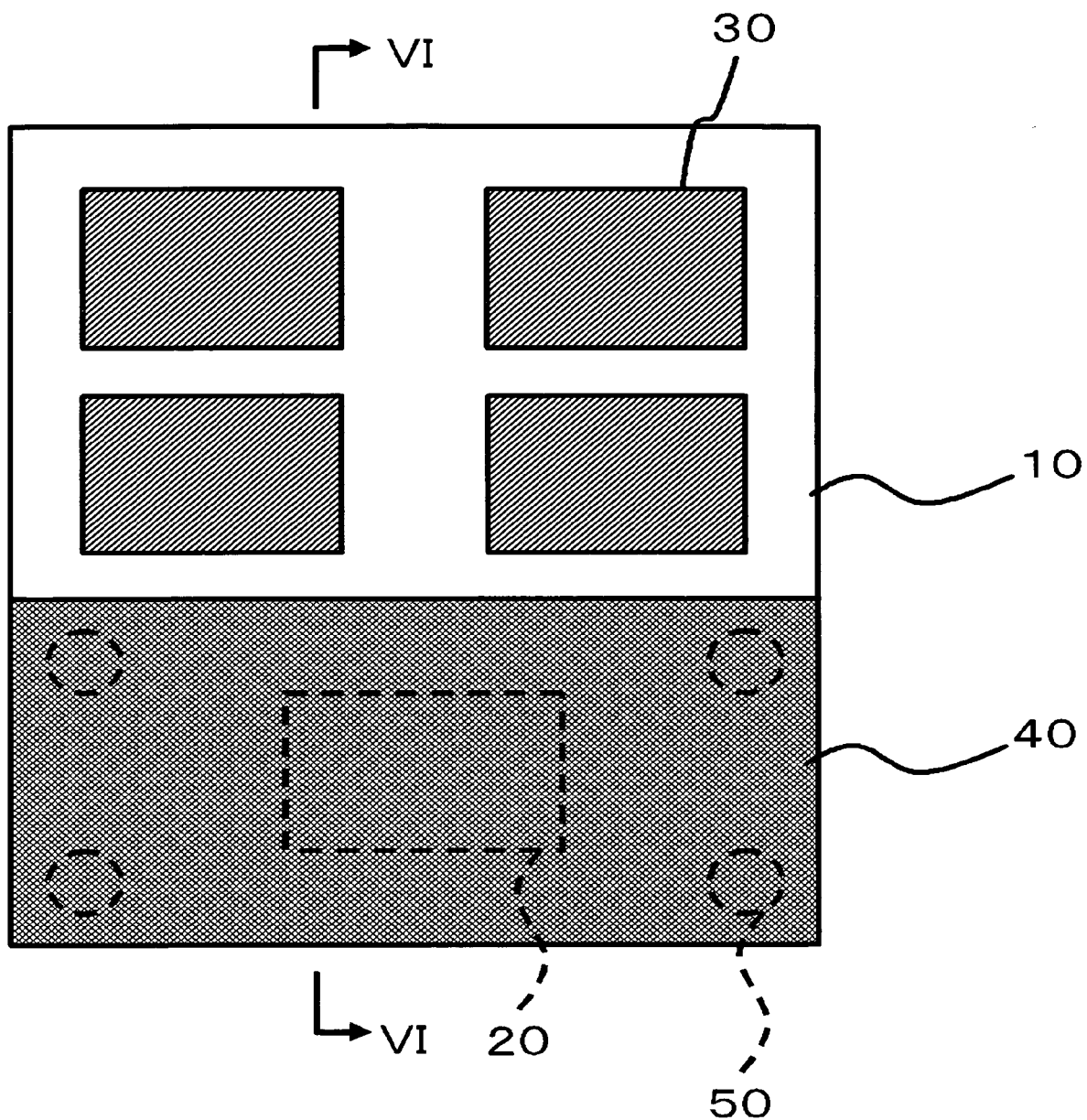
FIG. 5 is a plan view, showing a semiconductor device according to a modified embodiment according to the present invention.
Figure 6:
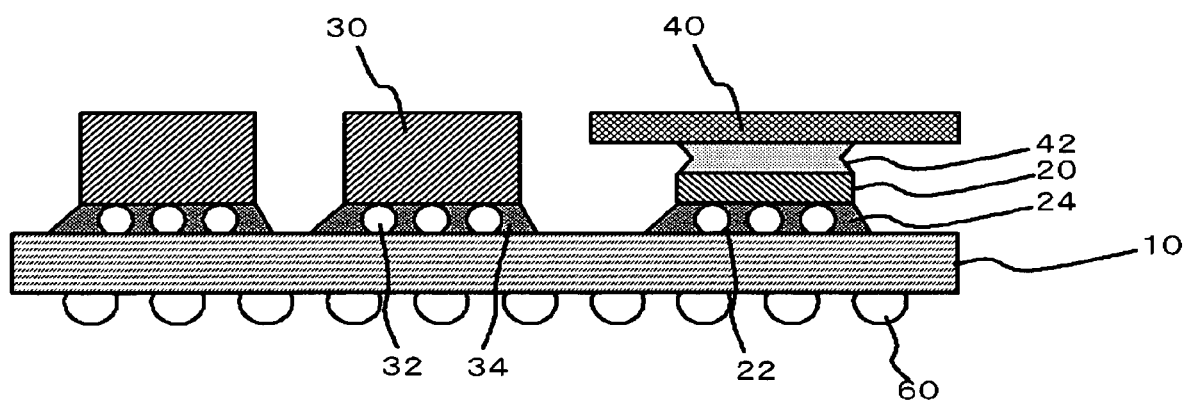
FIG. 6 is a cross-sectional view of the device along line VI-VI of FIG. 5.

It is not intended that the semiconductor device according to the present invention is not limited to the configurations illustrated in the above-described embodiments, and various modifications thereof are available. For example, while the configuration of the heat sink 40 having the defected portions is illustrated in the above-described embodiment, the heat sink 40 may include no defected portion, as shown in FIG. 5. In the semiconductor device shown in FIG. 5, one semiconductor chip 20 and four semiconductor chips 30 are mounted on a substrate 10, similarly as in the semiconductor device 1, and among the semiconductor chip 20 and the semiconductor chips 30, only above the semiconductor chip 20 is provided with the heat sink 40. However, in this embodiment, the geometry of the heat sink 40 is a rectangle. Further, resin posts 50 are connected to the respective four corners of the heat sink 40. FIG. 6 shows a cross-sectional view of the device along line VI-VI of FIG. 5.

Figure 7:
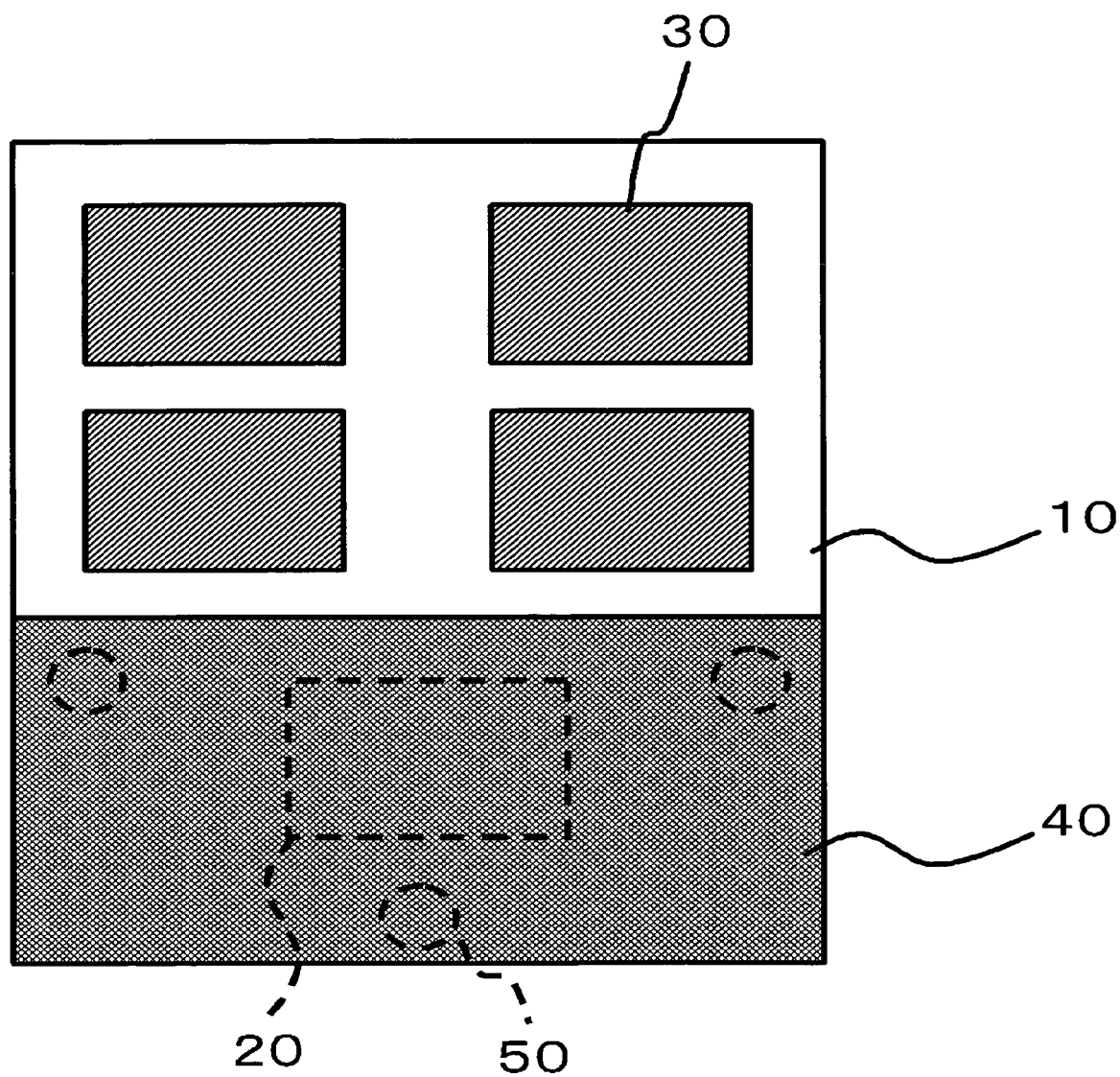
FIG. 7 is a plan view, showing a semiconductor device according to another modified embodiment according to the present invention.

It is not essential to provide the resin posts 50 in four locations, and the resin post(s) 50 may be provided in any number of location(s) including one location. FIG. 7 shows an exemplary implementation of the device having resin posts 50 located in three locations.

Figure 8:
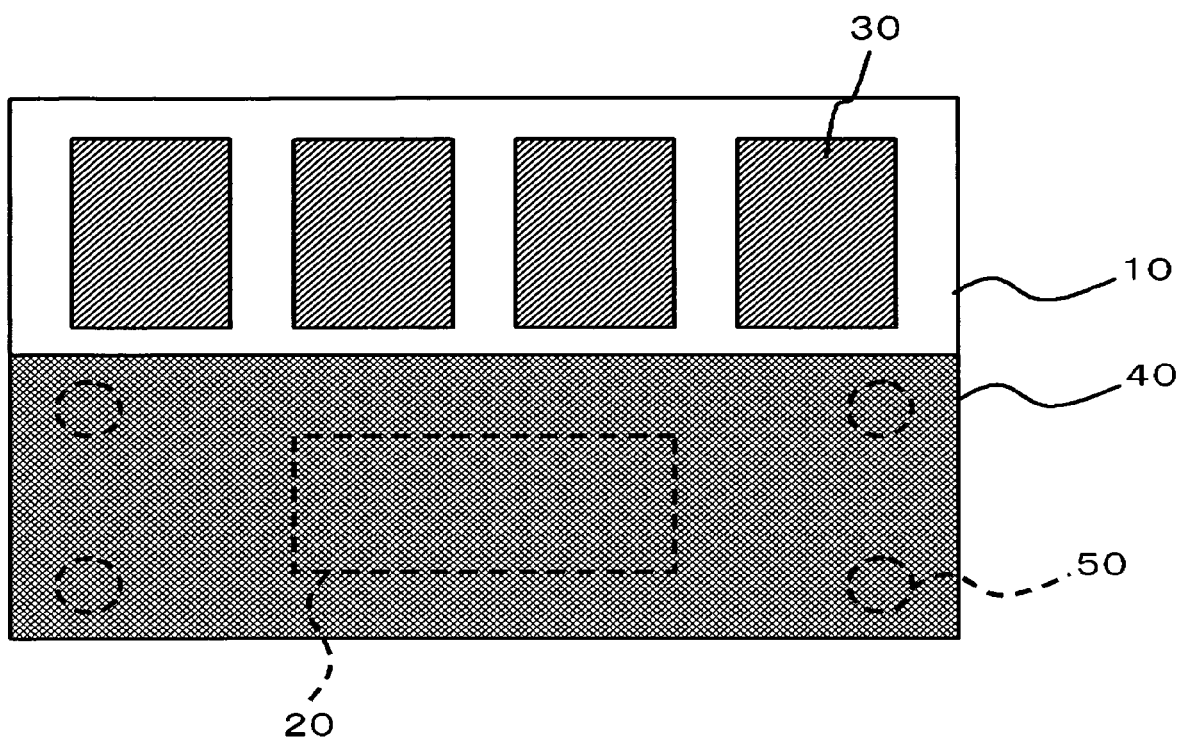
FIG. 8 is a plan view, showing a semiconductor device according to further modified embodiment according to the present invention.
Figure 9:
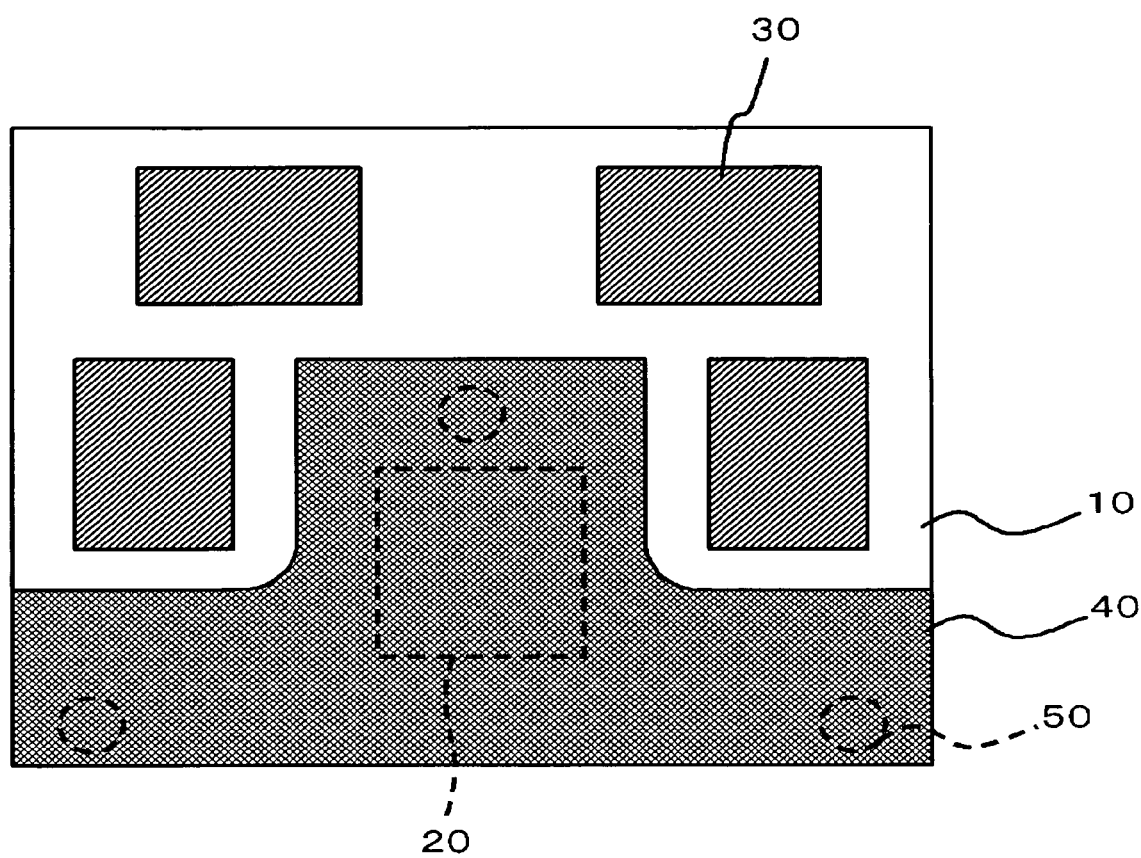
FIG. 9 is a plan view, showing a semiconductor device according to yet other modified embodiment according to the present invention.

The arrangement of the semiconductor chips 20 and 30 and the corresponding geometry of the heat sink 40 are not limited to that illustrated in FIG. 1 or FIG. 5, and various configurations including configurations shown in FIG. 8 or FIG. 9 may be considered.

Figure 10:
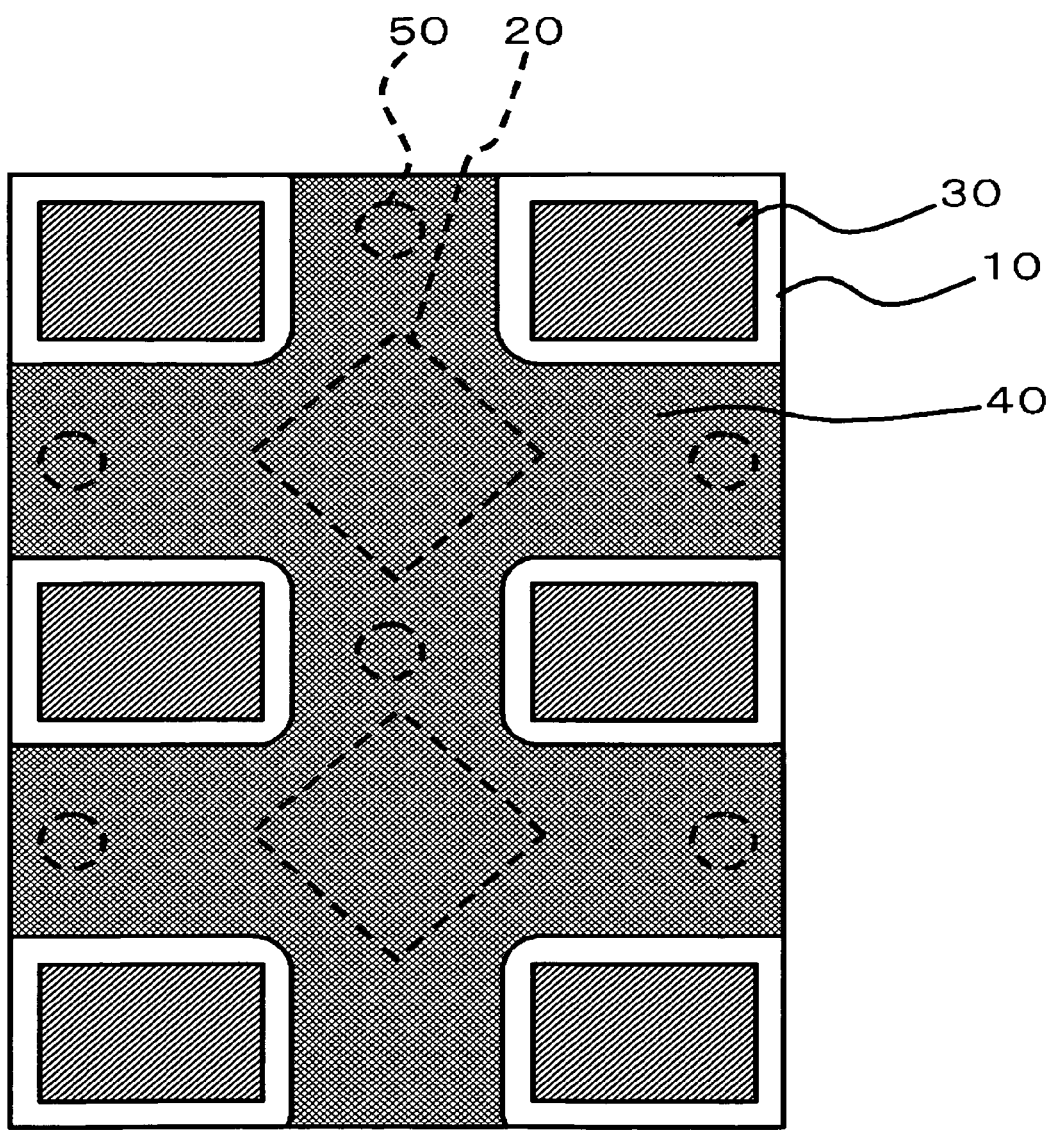
FIG. 10 is a plan view, showing a semiconductor device according to further yet other modified embodiment according to the present invention.

While the exemplary implementation employing one semiconductor chip 20 and a plurality of semiconductor chips 30 provided on the substrate is described in the above-described embodiment, one semiconductor chip 20 and one semiconductor chip 30 may be provided, or a plurality of semiconductor chips 20 and a plurality of semiconductor chips 30 may be provided. FIG. 10 illustrates an exemplary implementation of a device having two semiconductor chips 20 and six semiconductor chips 30, which are installed on a substrate 10. In this exemplary implementation, defected portions are provided in six locations of the heat sink 40.

While the combination of the logic circuit and the memory circuit are exemplified for illustrating the combination of the semiconductor chip 20 and the semiconductor chip 30 in the above-described embodiment, both of the semiconductor chip 20 and the semiconductor chip 30 may be logic circuits, or may be memory circuits.

It is apparent that the present invention is not limited to the above embodiment, and may be modified and changed without departing from the scope and spirit of the invention.

What is claimed is:

1. A semiconductor device, comprising:
   a substrate;
   a first semiconductor chip and a second semiconductor chip provided on said substrate; and
   a heat sink fixed onto said first semiconductor chip,
   wherein a height of a top surface of said first semiconductor chip from said substrate is lower than a height of a top surface of said second semiconductor chip from said substrate,
   wherein said heat sink is provided only above said first semiconductor chip out of said first and second semiconductor chips,
   wherein a height of a top surface of said heat sink from said substrate is substantially the same as a height of a top surface of said second semiconductor chip from said substrate,
   wherein, in plan view, said heat sink has a geometry of a rectangle partially having a defected portion and having a polygon which has at least five sides, and
   said second semiconductor chip is disposed in said defected portion.

2. The semiconductor device according to claim 1,
   wherein said first and second semiconductor chips are a logic circuit and a memory circuit, respectively.

3. The semiconductor device according to claim 1,
   wherein said first semiconductor chip is a bare chip, and said second semiconductor chip is a packaged chip.

4. The semiconductor device according to claim 1,
   wherein said heat sink is flat plate-shaped.

5. The semiconductor device according to claim 1, further comprising a resin post provided between said substrate and said heat sink,
   wherein one end and the other end of said resin post are connected to said substrate and said heat sink, respectively.

6. The semiconductor device according to claim 1,
   wherein said second semiconductor chip includes an external electrode terminal, and is connected through said external electrode terminal to said substrate.

7. The semiconductor device according to claim 1,
   wherein no sharp corner in a planar view is included in a boundary between said heat sink and said defected portion.

8. The semiconductor device according to claim 1,
   wherein a plurality of said second semiconductor chips are provided on said substrate; and
   a portion of said heat sink extends to a space between said second semiconductor chips.

9. The semiconductor device according to claim 8,
   wherein said heat sink includes a base and a protruding portion protruded from said base;
   said base is located above said first semiconductor chip; and
   said protruding portion extends to said space between said second semiconductor chips.

10. The semiconductor device according to claim 1, wherein in plan view, a side of said substrate and a side of heat sink partially overlap each other.

11. The semiconductor device according to claim 1, wherein said defected portion is formed by defecting at least part of at least one corner.

12. The semiconductor device according to claim 1, wherein said defected portion is formed by defecting at least part of at least one side.

13. A semiconductor device, comprising:
    a substrate;
    a first semiconductor chip provided on said substrate; and
    plural second semiconductor chips provided on said substrate and surrounding said first semiconductor chip;
    a heat sink overlying only said first semiconductor chip,
    wherein a height of a top surface of said first semiconductor chip from said substrate is less than a height of a top surface of said second semiconductor chips from said substrate,
    wherein a top surface of said heat sink is substantially coplanar with a top surface of said second semiconductor chips,
    wherein, in plan view, said heat sink has a geometry of a rectangle partially having a defected portion and having a polygon which has at least five sides, and
    said second semiconductor chip is disposed in said defected portion.

14. The semiconductor device according to claim 13, wherein said first and second semiconductor chips are a logic circuit and a memory circuit, respectively.

15. The semiconductor device according to claim 13, wherein said first semiconductor chip is a bare chip, and said second semiconductor chips are packaged chips.

16. The semiconductor device according to claim 13, wherein said heat sink has a rectangular geometry having portions removed, said second semiconductor chips being disposed in said removed portions.

17. The semiconductor device according to claim 16, wherein no sharp corner is included in a boundary between said heat sink and said removed portions, in plan view.

18. The semiconductor device according to claim 13, further comprising plural resin posts provided between said substrate and said heat sink, one respective end of said resin posts being connected to said substrate and another respective end of said resins posts being connected to said heat sink.

19. The semiconductor device according to claim 18, wherein said heat sink is cross-shaped with two adjacent ones of said plural second semiconductor chips being on either side of the cross.

20. The semiconductor device according to claim 13, wherein in plan view, a side of said substrate and a side of heat sink partially overlap each other.

21. The semiconductor device according to claim 13, wherein said defected portion is formed by defecting at least part of at least one corner.

22. The semiconductor device according to claim 13, wherein said defected portion is formed by defecting at least part of at least one side.

23. A semiconductor device, comprising:
a substrate;
a first semiconductor chip provided on said substrate; and
plural second semiconductor chips provided on said substrate;
a heat sink overlying only said first semiconductor chip,
wherein a height of a top surface of said heat sink from said substrate is substantially the same as a height of a top surface of said second semiconductor chips from said substrate,
wherein, in plan view, said heat sink has a geometry of a rectangle partially having a defected portion and having a polygon which has at least five sides, and
said second semiconductor chip is disposed in said defected portion.

24. The semiconductor device according to claim 23, wherein in plan view, a side of said substrate and a side of heat sink partially overlap each other.

25. The semiconductor device according to claim 23, wherein said defected portion is formed by defecting at least part of at least one corner.

26. The semiconductor device according to claim 23, wherein said defected portion is formed by defecting at least part of at least one side.

* * * * *